(12) United States Patent
Hsu

(10) Patent No.: US 6,965,333 B1
(45) Date of Patent: Nov. 15, 2005

(54) CIRCUIT FOR USING CAPACITOR VOLTAGE DIVIDER IN A DELTA-SIGMA DIGITAL-TO-ANALOG CONVERTER TO GENERATE REFERENCE VOLTAGE

(75) Inventor: Chi-Lin Hsu, Zhong-He (TW)

(73) Assignee: Princeton Technology Corporation, Taipei (TW)

( * ) Notice: Subject to any disclaimer, the term of this patent is extended or adjusted under 35 U.S.C. 154(b) by 0 days.

(21) Appl. No.: 11/103,546

(22) Filed: Apr. 12, 2005

(51) Int. Cl.$^7$ ............................................. H03M 3/00
(52) U.S. Cl. ...................... 341/143; 341/120; 341/145; 341/150
(58) Field of Search ................ 341/143, 144, 341/145, 120, 154, 150, 172, 118

(56) References Cited

U.S. PATENT DOCUMENTS 6,140,950 A * 10/2000 Oprescu ..................... 341/143
6,147,522 A * 11/2000 Rhode et al. ................. 327/93
6,570,519 B1 * 5/2003 Yang ........................... 341/143
6,573,850 B1 * 6/2003 Pennock ..................... 341/150

* cited by examiner

Primary Examiner—John B Nguyen
(74) Attorney, Agent, or Firm—Bacon & Thomas PLLC

(57) ABSTRACT

An improved circuit for a delta-sigma digital-to-analog converter comprises integrating operational amplifier, sampling capacitors, integrating capacitor, and a voltage divider consisting of a plurality of sampling capacitors. Three trigger signals of different phases are designed to control three sets of switches, a first trigger signal only turns on and off a first set of switches, so as to charge the plurality of sampling capacitors, a second trigger signal only turns on and off a second set of switches, so as to enable the charge on one of the sampling capacitor and the charge on the integrating capacitor to be averaged, a third trigger signal only turns on and off a third set of switches, to enable the plurality of sampling capacitors to be discharged.

1 Claim, 3 Drawing Sheets

(a)

(b)

(a)

(b)

US 6,965,333 B1

CIRCUIT FOR USING CAPACITOR VOLTAGE DIVIDER IN A DELTA-SIGMA DIGITAL-TO-ANALOG CONVERTER TO GENERATE REFERENCE VOLTAGE

FIELD OF THE INVENTION

The present invention relates to a delta-sigma digital-to-analog converter, and more particularly to an improved circuit design for using capacitor voltage dividers in a delta-sigma digital-to-analog converter to generate reference voltage.

BACKGROUND OF THE INVENTION

As shown in FIG. 1, which is an illustrative view for showing a delta-sigma digital-to-analog converter. The delta-sigma digital-to-analog converter comprises an interpolation filter 1, a noise shaping loop 2, a digital-to-analog converter 3 and an analog low-pass filter 4, wherein a digital signal D is inputted to the interpolation filter 1, and an analog signal A is outputted from the analog low-pass filter 4.

FIG. 2(a) shows a circuit diagram of the digital-to-analog converter 3, located at the left side of which is the circuit for generating reference voltage, including resistors R1, R2, R3 and operational amplifiers 21, 22 which are electrically connected as shown. The generated reference voltage $V_{ref+}$ and $V_{ref-}$ will be inputted respectively to an end of the switches 24, 25, 26 and 28. Located at the right side of FIG. 2(a) is an digital-to-analog converter comprising switches 23, 24, 25, 26, 28, 29, a sampling capacitor Cs, an integrating capacitor Ci and an integrating operational amplifier 27, which are connected as shown.

FIG. 2(b) is an illustrative view of the signals for controlling the switches 23, 24, 25, 26, 28 and 29, wherein $\phi 1$ controls the switches 24, 25, 26 and 28, and $\phi 2$ controls the switches 23 and 29. The high level means that the switch is closed, while the lower level represents opening of the switch. The $\phi 1$, the input signal IN (output of the noise shaping loop 2) are inputted to AND gate 1 (AND 1), the inverter (INV), and AND gate (AND2), the connection is shown in FIG. 2(a). When the signal $\phi 1$ is at high level, and the input signal IN is at high level, the switches 24, 26 are turned on, at this moment, the voltage difference $(V_{ref+}-V_{ref-})$ will charge the capacitor Cs. When the signal $\phi 1$ is at high level, and the input signal IN is at low level, the switches 25, 28 are turned on, the voltage difference $(V_{ref-}-V_{ref+})$ will charge the capacitor Cs. When the signal $\phi 2$ is at high level, the switches 23, 29 are turned on, at this moment the signal $\phi 1$ enables the switches 24, 25, 26 and 28 to be turned off, so that the charge on the sampling capacitor Cs and that on the integrating capacitor Ci will be averaged based on their respective capacitances, thus forming 1-bit digital-to-analog converting. If a plurality of sampling capacitors Cs1, Cs2, Cs3 . . . are parallel connected with Cs, and the sampling capacitors Cs1, Cs2, Cs3 . . . are provided with a plurality of switches, just like the switches 23, 24, 25, 26, 28, 29, then the charges on the sampling capacitors Cs, Cs1, Cs2, Cs3 . . . and the integrating capacitor Ci can be averaged simultaneously. Therefore, a so-called multi-bits digital-to-analog converter is formed.

However, as shown in FIG. 2, to make the reference voltages $V_{ref+}$, $V_{ref-}$ of the digital-to-analog converter 3 more accurate, it must use the operational amplifiers 21, 22 as buffers, but the problem is that the operational amplifiers 21, 22 are big, it will increase the cost. Furthermore, when the capacitance of the sampling capacitors Cs, Cs1, Cs2, Cs3 . . . increases, the operational amplifiers 21, 22 will inevitably be increased in power consumption, this will lead to a further size increasing of the operational amplifiers 21, 22, and the cost will be increased much more.

The present invention has arisen to mitigate and/or obviate the afore-described disadvantages.

SUMMARY OF THE INVENTION

The primary objective of the present invention is to provide an improved circuit design for a delta-sigma digital-to-analog converter. A delta-sigma digital-to-analog converter being conventionally provided with integrating operational amplifier, sampling capacitors, integrating capacitor, resistor voltage divider and operational amplifier buffers, wherein a reference voltage generating circuit consisted of the resistor voltage divider and the operational amplifier buffers are replaced by a capacitor voltage divider, and three trigger signals of different phases are designed to control three sets of switches, a first trigger signal only turns on and off a first set of switches, so as to charge the sampling capacitors, a second trigger signal only turns on and off a second set of switches, so as to enable the charge on one of the sampling capacitors and the charge on the integrating capacitor to be averaged, a third trigger signal only turns on and off a third sets of switches, so as to enable the plurality of sampling capacitors to be discharged.

The present invention will become more obvious from the following description when taken in connection with the accompanying drawings, which show, for purpose of illustrations only, the preferred embodiment in accordance with the present invention.

DETAILED DESCRIPTION OF THE PREFERRED EMBODIMENT

Figure 1:
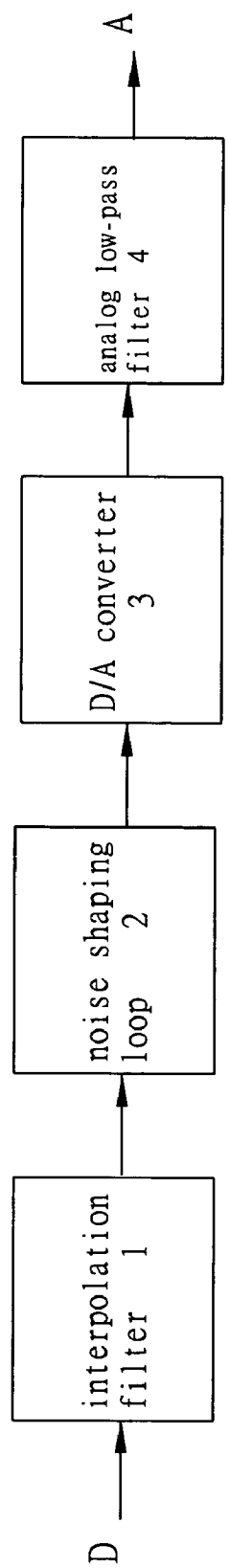
FIG. 1 is an illustrative view for showing a delta-sigma digital-to-analog converter.
Figure 2:
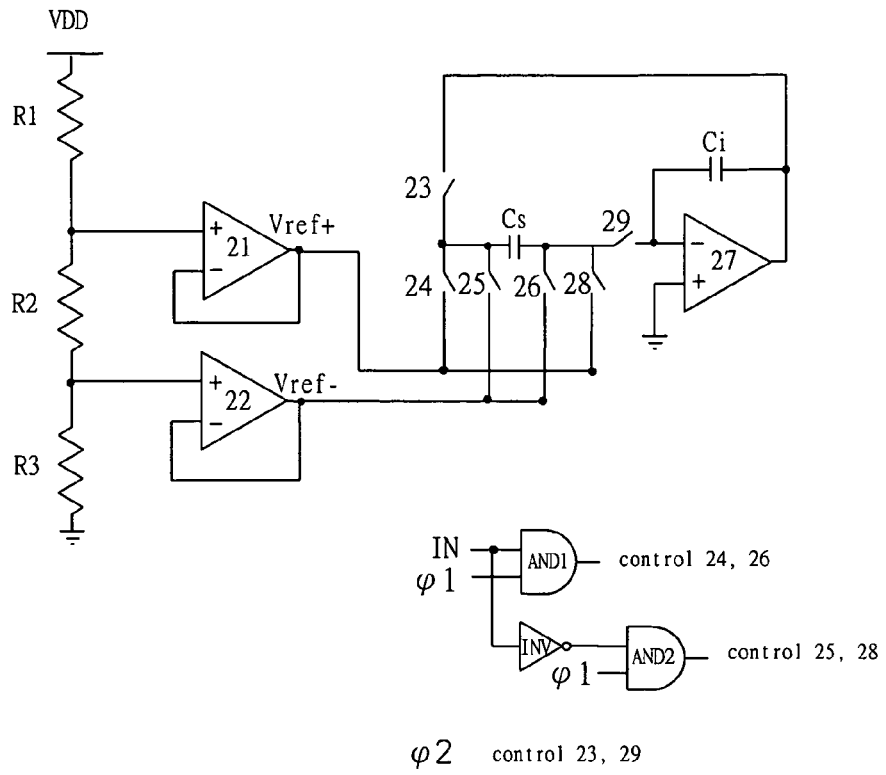
FIG. 2 is a circuit diagram of a conventional digital-to-analog converter.
Figure 2:
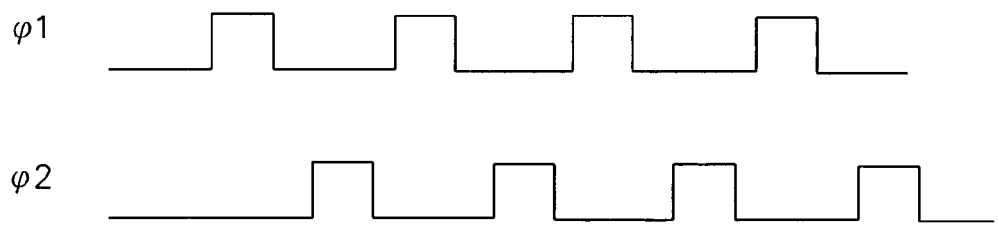
Figure 3:
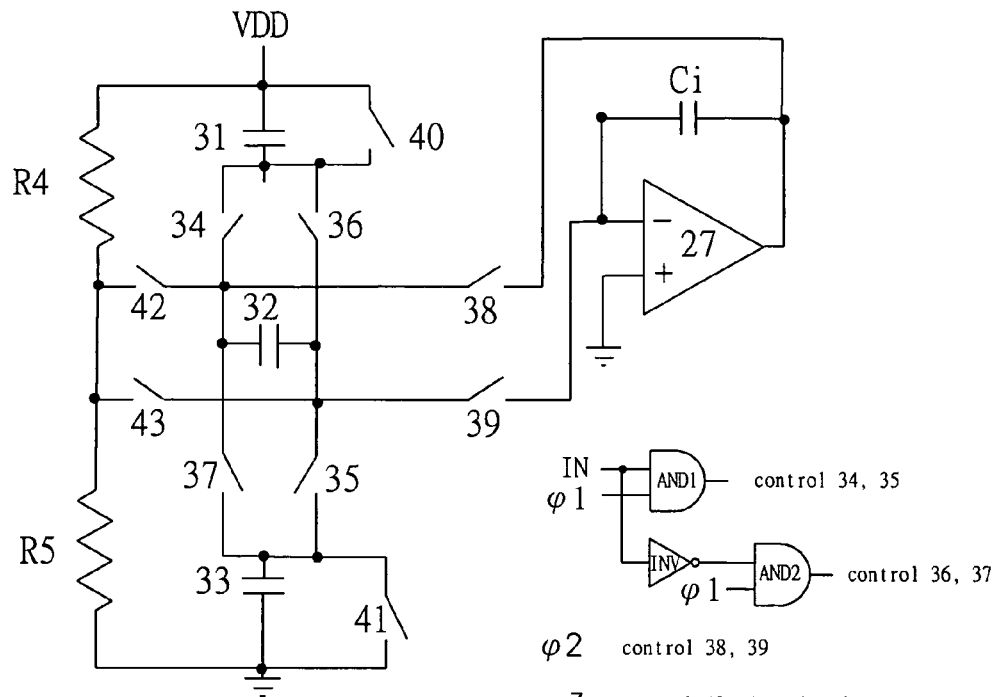
FIG. 3 shows a reference voltage generating circuit for a digital-to-analog converter in accordance with the present invention.
Figure 3:
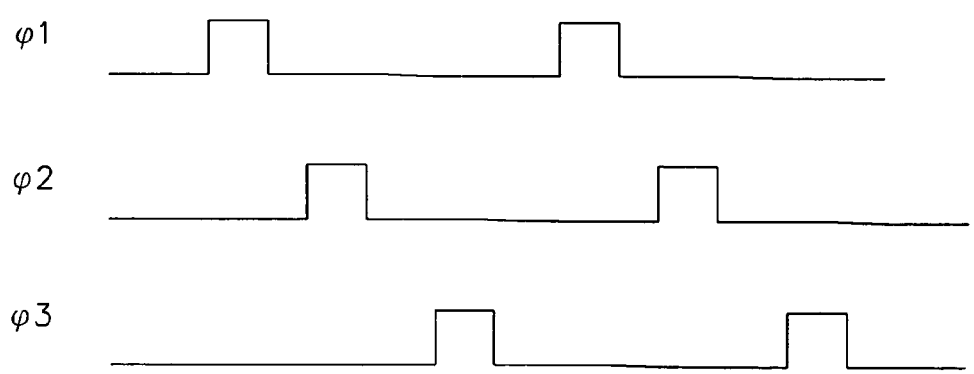

Referring to FIG. 3, a reference voltage generating circuit for a digital-to-analog converter in accordance with the present invention is shown, which comprises sampling capacitors 31, 32 and 33 that are used to replace the resistors R1, R2 and R3 in FIG. 2, ten switches 34, 35, 36, 37, 38, 39, 40, 41, 42, 43 and two resistors R4 and R5, these components are connected as shown in FIG. 3(a) and are used to replace the voltage divider circuit at the left side of the FIG. 2(a).

FIG. 3(b) is an illustrative view for showing the signals to control the switches 34, 35, 36, 37, 38, 39, 40, 41, 42 and 43, wherein the signal $\phi 1$ controls switches 34, 35, 36 and 37, the signal $\phi 2$ controls the switches 38 and 39, the signal $\phi 3$ controls the switches 40, 41, 42 and 43. The high level means that the switch is turned on, while the lower level represents the switch is turned off. The signal $\phi 1$, the input signal IN (output of the noise shaping loop 2) are inputted to AND gate 1 (AND 1), the inverter (INV), and AND gate 2 (AND2), the connections are shown in FIG. 3(a). When the signal $\phi 1$ is at high level, and the input signal IN is at high level, the switches 34, 35 are turned on, at this moment, the voltage source $V_{DD}$ will charge the sampling capacitors 31, 32 and 33. When the signal φ1 is at high level, and the input signal IN is at low level, the switches 36, 37 are turned on, at this moment, the voltage source $V_{DD}$ will charge the sampling capacitors 31, 32 and 33 too, however, the voltage of the sampling capacitors will be opposite in direction to the voltage of the sampling capacitors when the input signal IN is at high level. When the signal φ2 is at high level, the switches 38, 39 are turned on, at this moment the signal φ1 enables the switches 34, 35, 36 and 37 to be turned off, so that the charge on the sampling capacitor 32 and that on the integrating capacitor Ci will be averaged based on their respective capacitances. When the signal φ3 turns on the switches 40, 41, 42 and 43, the sampling capacitors 31, 32 and 33 will be discharged.

Since the resistors R1, R2 and R3 of FIG. 2 are replaced by the sampling capacitors 31, 32 and 33, the operational amplifiers 21, 22 in FIG. 2(*a*) can be omitted, and the cost and size of the circuit will be effectively reduced, but the circuit must be controlled by the three-trigger signals φ1, φ2 and φ3 of different phases.

While we have shown and described various embodiments in accordance with the present invention, it should be clear to those skilled in the art that further embodiments may be made without departing from the scope of the present invention.

What is claimed is:

1. A circuit design for a delta-sigma digital-to-analog converter, the delta-sigma digital-to-analog converter being conventionally provided with integrating operational amplifier, sampling capacitors, integrating capacitor, resistor voltage divider and operational amplifier buffers, wherein a reference voltage generating circuit consisted of the resistor voltage divider and the operational amplifier buffers is replaced by a voltage divider consisting of a plurality of sampling capacitors; and three trigger signals of different phases are designed to control three sets of switches, a first trigger signal only turns on and off a first set of switches, so as to charge the plurality of sampling capacitors, a second trigger signal only turns on and off a second set of switches, so as to enable the charge on one of the sampling capacitors and the charge on the integrating capacitor to be averaged, a third trigger signal only turns on and off a third set of switches, to enable the plurality of sampling capacitors to be discharged.

* * * * *